(12) United States Patent
Harvey

(10) Patent No.: US 6,982,600 B2
(45) Date of Patent: Jan. 3, 2006

(54) CLASS G-AMPLIFIERS

(75) Inventor: Barry Harvey, Los Altos, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

(21) Appl. No.: 10/848,391

(22) Filed: May 18, 2004

(65) Prior Publication Data
US 2005/0195036 A1    Sep. 8, 2005

Related U.S. Application Data

(60) Provisional application No. 60/549,517, filed on Mar. 2, 2004.

(51) Int. Cl.
H03F 3/18          (2006.01)
(52) U.S. Cl. ..................... 330/263; 330/255
(58) Field of Classification Search ............... 330/263, 330/255, 257, 261, 267
See application file for complete search history.

(56) References Cited

U.S. PATENT DOCUMENTS

| | | | |
|---|---|---|---|
| 5,128,564 A | 7/1992 | Harvey et al. | 307/494 |
| 5,179,355 A | 1/1993 | Harvey | 330/265 |
| 5,387,876 A | 2/1995 | Sondermeyer | 330/251 |
| 5,418,495 A | 5/1995 | Harvey | 330/265 |
| 5,578,967 A | 11/1996 | Harvey | 330/263 |
| 5,589,798 A | 12/1996 | Harvey | 330/263 |
| 6,184,750 B1 | 2/2001 | Somerville | 330/255 |
| 6,215,356 B1 | 4/2001 | Servaes et al. | 330/251 |
| 6,229,394 B1 | 5/2001 | Harvey | 330/252 |
| 6,236,273 B1 | 5/2001 | Lewyn | 330/297 |
| 6,323,729 B1 * | 11/2001 | Sevenhans et al. | 330/51 |
| 6,448,853 B1 | 9/2002 | Harvey | 330/252 |
| 6,538,514 B2 * | 3/2003 | Harvey | 330/265 |

* cited by examiner

Primary Examiner—Henry Choe
(74) Attorney, Agent, or Firm—Fliesler Meyer LLP

(57) ABSTRACT

An output stage for a Class-G amplifier includes four current mirrors, (CmpL) powered by a first low voltage supply (VspL), (Cmph) powered by a first high voltage supply (Vsph), (CmmL) powered by a second low voltage supply (VsmL), and (Cmmh) powered by a second high voltage supply (Vsmh). The outputs of the current mirrors are connected together to form an output of the output stage. A buffer (10), whose input forms an input to the output stage, includes a first transistor (19) and a second transistor (27) connected in an emitter follower configuration, which are used to steer the buffer's output either through the first transistor (19) to a first switch (69) or through the second transistor (27) to a second switch (84). The first switch (69), which is controlled by a first comparator (68) connects a collector of the first transistor (19) to either the input to the first current mirror (CmpL) or the input to said second current mirror (Cmph). The second switch (84), which is controlled by a second comparator (82) connects a collector of the second transistor (27) to either the input to the third current mirror (CmmL) or the input to the fourth current mirror (Cmmh). This description is not intended to be a complete description of, or limit the scope of, the invention. Other features, aspects, and objects of the invention can be obtained from a review of the specification, the figures, and the claims.

26 Claims, 7 Drawing Sheets

US 6,982,600 B2

CLASS G-AMPLIFIERS

PRIORITY CLAIM

This application claims priority under 35 U.S.C. 119(e) to U.S. Provisional Application No. 60/549,517, filed Mar. 2, 2004, entitled CLASS G-AMPLIFIERS, which is incorporated herein by reference.

FIELD OF THE INVENTION

Embodiments of the present invention relate to Class-G amplifiers.

BACKGROUND

Most amplifiers have push-pull output devices that are biased in a Class-AB manner. Such amplifiers draw a nominal quiescent current from the power supplies that must be at a voltage high enough to drive the largest output signal, even if the majority of the output signal is relatively low, with only occasional large peaks. For example, in the case of Digital Subscriber Line (DSL) signals, the majority of the signal is at a relative low level, with only occasional large output peaks. This results in the standard Class-AB output stage wasting about five times the delivered output power. Accordingly, Class-AB amplifiers are inefficient in that they waste a large amount of power. It is desirable to provide more efficient amplifiers.

SUMMARY OF THE PRESENT INVENTION

The present invention relates to Class-G amplifiers, and more specifically, to output stages of Class-G amplifiers. In accordance with an embodiment of the present invention, the output stage for a Class-G amplifier, includes four current mirrors. The four current mirrors can include, as shown in FIG. 2, a first current mirror (CmpL) powered by a first low voltage supply (VspL), a second current mirror (Cmph) powered by a first high voltage supply (Vsph), a third current mirror (CmmL) powered by a second low voltage supply (VsmL), and a fourth current mirror (Cmmh) powered by a second high voltage supply (Vsmh). Each of the current mirror includes an input and an output. The outputs of the current mirrors are connected together to form an output of the output stage.

A buffer (10) includes an input (node G) and an output (node X). In accordance with an embodiment of the present invention, the buffer (10) also including a first transistor (19) and a second transistor (27) connected in an emitter follower configuration. The input of the buffer (10) forms an input of the output stage. In accordance with an embodiment of the present invention, the buffer (10) steers its output either through the first transistor (19) to a first switch (69), or through the second transistor (27) to a second switch (84).

The first switch (69) connects a collector of the first transistor (19) to either the input to the first current mirror (CmpL) or the input to said second current mirror (Cmph). A first comparator (68) receives the input (node G) to the buffer (10) (or the output of the buffer 10, which is a buffered version of the input to the buffer 10) and a first reference voltage (refp), and provides an output that controls whether the first switch (69) connects the collector of the first transistor (19) to either the input to the first current mirror (CmpL) or the input to the second current mirror (Cmph). Similarly, the second switch (84) connects a collector of the second transistor (27) to either the input to the third current mirror (CmmL) or the input to the fourth current mirror (Cmmh). A second comparator (82) receives the input (node G) to the buffer (10) (or the output of the buffer 10, which is a buffered version of the input to the buffer 10) and a second reference voltage (refm), and provides an output that controls whether the second switch (84) connects the collector of the second transistor (27) to either the input to the third current mirror (CmmL) or the input to the fourth current mirror (Cmmh).

In accordance with an embodiment of the present invention, the first switch (69) includes an input terminal and first and second output terminals. The input terminal is connected to the collector of the first transistor (19), the first output terminal is connected to the input to the first current mirror (CmpL), and the second output terminal is connected to the input to the second current mirror (Cmph). Similarly, the second switch (84) includes an input terminal and first and second output terminals, the input terminal of the second switch is connected to the collector of the second transistor (27), the first output terminal is connected to the input to the third current mirror (CmmL), and the second output terminal is connected to the input to the fourth current mirror (Cmmh).

In accordance with an embodiment of the present invention, the first comparator (68) and the first switch (69) collectively include a third transistor (100) and a fourth transistor (102). The third transistor (100) includes a base connected to the input (node X) to the buffer (10) (or the output of the buffer 10, which is a buffered version of the input to the buffer 10), a collector connected to the input to the second current mirror (Cmph), and an emitter connected to the collector of the first transistor (19). The fourth transistor (102) includes a base receiving the first reference voltage (refp), a collector connected to the input to the first current mirror (CmpL), and an emitter connected to the collector of the first transistor (19). Similarly, the second comparator (82) and the second switch (84) collectively include a fifth transistor (104) and a sixth transistor (106). The fifth transistor (104) includes a base connected to the input (node X) to the buffer (10) (or the output of the buffer 10, which is a buffered version of the input to the buffer 10), a collector connected to the input to the fourth current mirror (Cmmh), and an emitter connected to the collector of the second transistor (27). The sixth transistor (106) includes a base receiving the second reference voltage (refm), a collector connected to the input to the third current mirror (CmmL), and an emitter connected to the collector of the second transistor (27).

In accordance with an embodiment of the present invention, the output stage also include first and second diodes (Dp, Dm). The first diode (Dp) is connected between the output of the first current mirror (CmpL) and the output of the output stage, to prevent the first current mirror (CmpL) from being reversed biased. Similarly, the second diode (Dm) is connected between the output of the third current mirror (CmmL) and the output of the output stage, to prevent the third current mirror (CmmL) from being reversed biased.

Further embodiments, and the features, aspects, and advantages of the present invention will become more apparent from the detailed description set forth below, the drawings and the claims.

DETAILED DESCRIPTION

The present invention relates to Class-G amplifiers. The so-called Class-G amplifier approach uses two sets of power supplies, including a lower voltage supply (or supplies) which provides the majority of the output and quiescent currents, and a higher voltage supply (or supplies) which provides the output current only for the occasional signal peaks. The amplifier switches between supplies with signal demand. Prior to discussing Class-G amplifiers, it is useful to first describe a possible implementation of a Class-AB amplifier with reference to FIG. 1.

Figure 1:
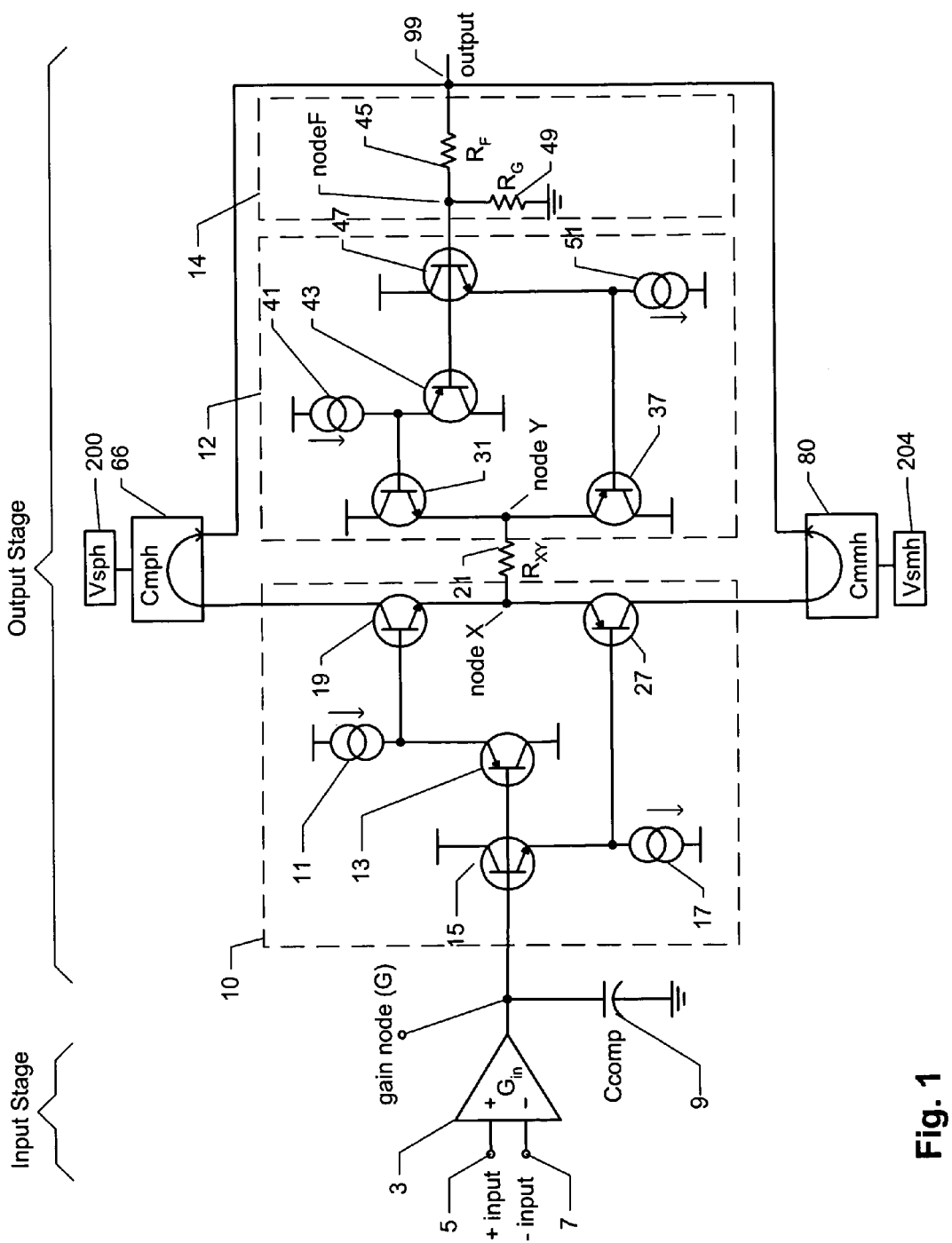
FIG. 1 is a schematic diagram depicting an exemplary Class-AB amplifier.

The Class-AB amplifier of FIG. 1 includes a differential input stage 3, which has a non-inverting input 5 and an inverting input 7. The output of the input stage is labeled gain node (G). A compensation capacitor 9 (Ccomp) is preferably connected between the gain node (G) and ground, to reduce and preferably eliminate oscillations at the gain node. Everything to the right of the input stage 3 can be considered an output stage of the amplifier. Thus, it can be said the signal at the gain node (G) is provided to the output stage.

The output stage includes a first buffer 10, a second buffer 12 (also referred to as a feedback buffer), voltage divider network 14, and a pair of current mirrors Cmph 66 and Cmmh 80. The current mirror Cmph 66 is powered by a high voltage supply 200 (Vsph). The current mirror Cmmh 80 is powered by a high voltage supply 204 (Vsmh). For ease of description, we will assume that Vsph 200 provides a positive voltage, e.g., +12V, and that Vsmh 204 provides a complimentary negative voltage 204, e.g., +12V. However, this is not necessary. Rather, it is possible that both voltage supplies provide positive voltages (e.g., Vsph 200 provides +20V, and Vsmh 204 provides +10V), that both voltage supplies provide negative voltages (e.g., Vsph 200 provides −10V, and Vsmh 204 provides −20V), or that voltage supplies are not complimentary (e.g., Vsph 200 provides +10V, and Vsmh 204 provides −5V).

The signal at the gain node (G) is provided to the buffer 10, which is shown as including transistors 15, 13, 19 and 27, and current sources 11 and 17. More specifically, the gain node (G) is connected to the bases of transistors 15 and 13. The collector of transistor 15 is connected to an upper rail, and the current source 17 connects the emitter of transistor 15 to a lower rail. The collector of transistor 13 is connected to the lower rail, and the current source 11 connects the emitter of transistor 13 to the upper rail. The emitter of transistor 15 is also connected to the base of transistor 27. The emitter of transistor 13 is also connected to the base of transistor 21.

The emitters of transistors 19 and 27 are shown as being connected to one another in an emitter follower configuration, and forming a node labeled X, which is the output of the buffer 10, which should be equal to the signal at gain node (G). The collector of transistor 19 is connected to the input of the current mirror 66 (Cmph), which is powered by Vsph 200, as mentioned above. The collector of transistor 27 is connected to the input of the current mirror 80 (Cmmh), which is powered by Vsmh 204, as mentioned above.

In general, (assuming Vsph 200 provides a positive voltage, e.g., +12V, and Vsmh provides a complimentary negative voltage, e.g., −12V), when the signal at node X is positive, transistors 19 and 27 are switched to cause the signal at node X to be steered through transistor 19 to the input of Cmph 66. Conversely, when the signal at node X is negative, transistors 19 and 27 are switched to cause the signal at node X to be steered through transistor 27 to the input of Cmmh 80.

Preferably, the currents mirrors Cmph 66 and Cmmh 80 have the same high gain (e.g., each have a gain of 100). Thus, when a small current is provided to one of the current mirrors Cmph 66 or Cmmh 66 (from the collector of transistor 19 or 27), a significantly larger current is output from that current mirror, which is the amplifier output 99.

The voltage divider circuit 14, which is shown as including a feedback resistor 45 ($R_F$) and a gain resistor 49 ($R_G$), produces a feedback signal at a feedback node (F). The signal at the feedback node (F) is provided to the feedback buffer 12. In this embodiment, the feedback buffer 12 includes substantially the same structure as the input buffer 10, although this is not necessary. More specifically, the feedback buffer 12 is shown as including transistors 47, 43, 31 and 37, and current sources 41 and 51. The feedback node (F) is connected to the bases of transistors 47 and 43. The collector of transistor 47 is connected to the upper rail, and the current source 51 connects the emitter of transistor 47 to the lower rail. The collector of transistor 43 is connected to the lower rail, and the current source 41 connects the emitter of transistor 43 to the upper rail. The emitter of transistor 47 is also connected to the base of transistor 32. The emitter of transistor 43 is also connected to the base of transistor 31.

The collector of transistor 31 is connected to the upper rail. The collector of transistor 37 is connected to the lower rail. The emitters of transistors 31 and 37 are shown as being connected to one another in an emitter follower configuration, and forming a node labeled Y, which is the output of feedback buffer 12, which should be equal to the signal at feedback node (F).

A resistor 21 ($R_{XY}$) is connected between the nodes X and Y. In operation, the first buffer 10 buffers the voltage at the gain node (G) and presents it to node X. The feedback buffer 12 buffers the voltage at the feedback node (F) and presents it to the node Y. If the voltage at the gain node (G) does not equal the voltage at the feedback node (F), or more specifically, if the voltage at node X does not equal the voltage at the node Y, then transistors 19 or 27 will conduct an error current, causing current mirror Cmph 66 or Cmmh 80 to return that error current to the amplifier output 99. In this manner, the voltage at the amplifier output 99 is servo'ed back to agreement with the voltage at the gain node (times the $R_F/R_G$ division ratio).

In practice, the current mirrors Cmph 66 and Cmmh 80 have substantial current gain, as mentioned above, and can even be made from power or Darlington transistors. Also, the voltage divider network 14 allows the voltage excursions at the gain node (G) to be less than that of the amplifier output swings, allowing the input stage 3 to be powered by a reduced supply voltage, or at least not limiting the output swing when running on the same voltage supplies as Cmph 66 and Cmmh 80. Furthermore, the values of $R_F$ 45 and $R_G$ 49 may be set so $R_F$ 45 is a short circuit (or zero ohms), and $R_G$ is an open circuit (or infinite ohms). This is the equivalent of removing the voltage divider network 14, and having the feedback node (F) equal the amplifier output 99.

In the Class-AB amplifier of FIG. 1, the voltage supplies Vsph 200 and Vsmh 204 must be high enough to drive the largest output signal, even if the majority of the output signal is relatively low, with only occasional large peaks. Accordingly, the class AB amplifier of FIG. 1 is inefficient in that it may waste a large amount of power. To increase the power efficiency, the Class-AB amplifier of FIG. 1 is modified, in accordance with embodiments of the present invention, to produce a Class-G amplifier.

Figure 2:
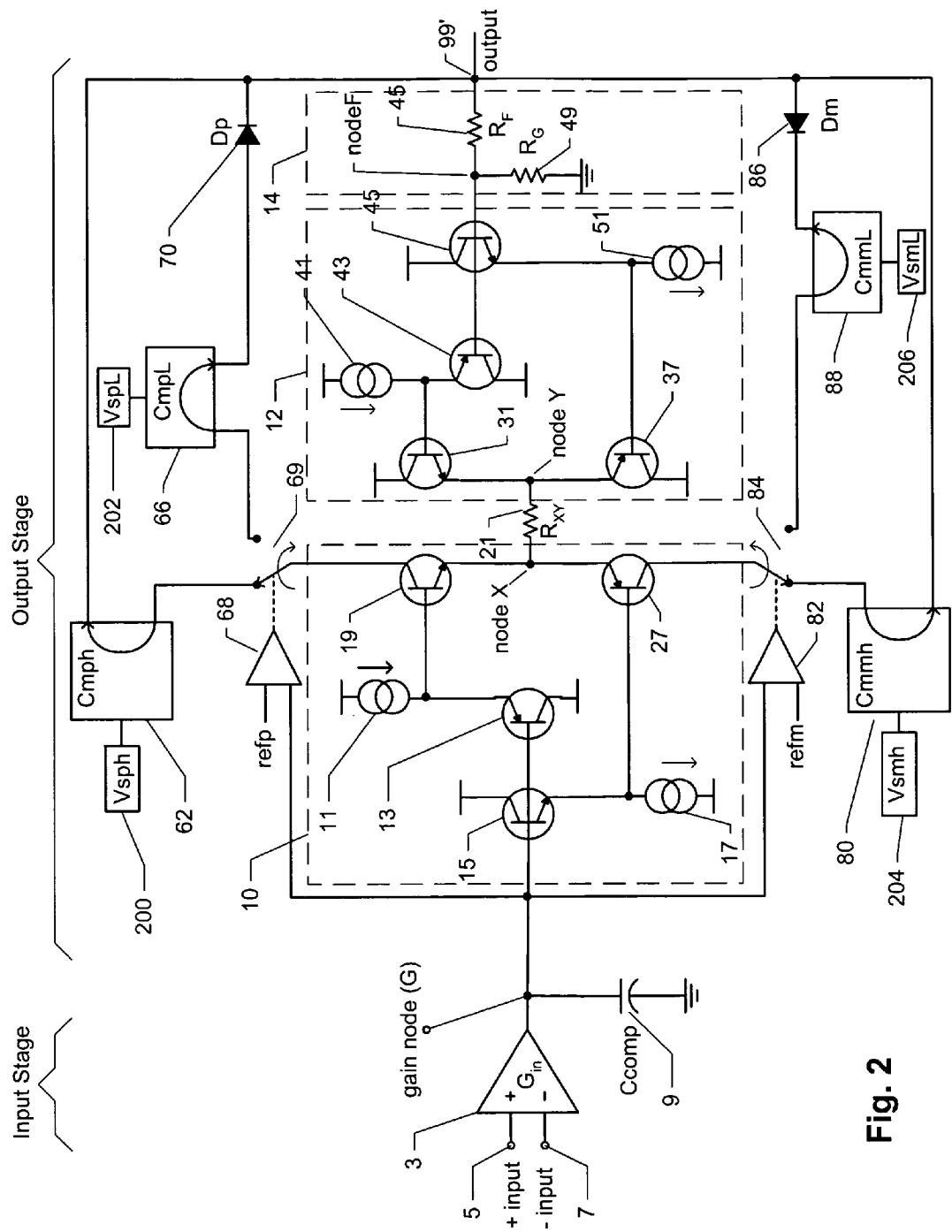
FIG. 2 is a schematic diagram depicting a Class-G amplifier, according to an embodiment of the present invention.

Referring now to FIG. 2, a Class-G amplifier, according to an embodiment of the present invention, is schematically shown. In this circuit, input stage 3, the first buffer 10, the feedback buffer 12, and the voltage divider network 14, operate in the same manner as they were described in the above discussion of FIG. 1. Accordingly, there is no need to describe these in detail again.

The Class-G amplifier of FIG. 2 additionally includes a low voltage supply 202 (VspL), e.g., +5V, which powers a current mirror CmpL. A low voltage supply 206 (VsmL), e.g., –5V, which powers a current mirror CmmL. For the following description we will assume that that Vsph 200 provides +12V, VspL 204 provides +5V, Vsmh 202 provides –12V, and VsmL 206 provides –5V. We will also assume that the upper and lower rails that drive the transistors and current sources within the buffers 10 and 12 run off VspL and VsmL (i.e., we will assume that within the buffers 10 and 12 the upper rail is +5V, and the lower rail is –5V).

Referring still to FIG. 2, a switch 69 steers the collector current of transistor 19 to the input of either current mirror Cmph 62 or current mirror CmpL 66. The switch 69 is controlled by a comparator 68, which compares voltage at the gain node (G) to a reference voltage (refp). More specifically, if the comparator 68 determines that a positive voltage at the gain node (G) is less than the reference voltage (refp), then the output of the comparator 68 will control the switch to cause the collector current of transistor 19 to be steered to the input of current mirror CmpL 66. If the comparator 68 determines that a positive voltage at the gain node (G) is greater than the reference voltage (refp), then the output of the comparator 68 will control the switch 69 to cause the collector current of transistor 19 to be steered to the input of current mirror Cmph 62.

Similarly, the output of a comparator 82 controls a switch 84, which steers the collector current of transistor 27 to the input of either current mirror Cmmh 80 or current mirror CmmL 88. More specifically, if the comparator 82 determines that a negative voltage at the gain node (G) is higher (e.g., less negative) than a reference voltage (refm), then the output of the comparator 68 will control the switch to cause the collector current of transistor 27 to be steered to the input of current mirror CmmL 88. If the comparator 82 determines that a negative voltage at the gain node (G) is lower (e.g., more negative) than the reference voltage (refm), then the output of the comparator 82 will control the switch 84 to cause the collector current of transistor 27 to be steered to the input of current mirror Cmmh 80.

In the above manner, power is saved because power is drawn from the lower voltage supplies VspL 202 and VsmL 206 (e.g., +5V and –5V), except during those situations where there are large signal excursions at the gain node (G). More specifically, power is only drawn from the higher voltage supplies Vsph 200 and Vsmh 204 (e.g., +12V and –12V) in those situations where the voltage at the gain node (G) swings outside the range defined by the reference voltages (refp) and (refm). The reference voltages (refp) and (refm) can be selected in an attempt to maximize efficiency. In the case of a DSL signal, the reference voltages can be set such that only about 1–3% of signal swings will draw power from the high voltage supplies Vsph 200 and Vsmh 204.

Figure 3:
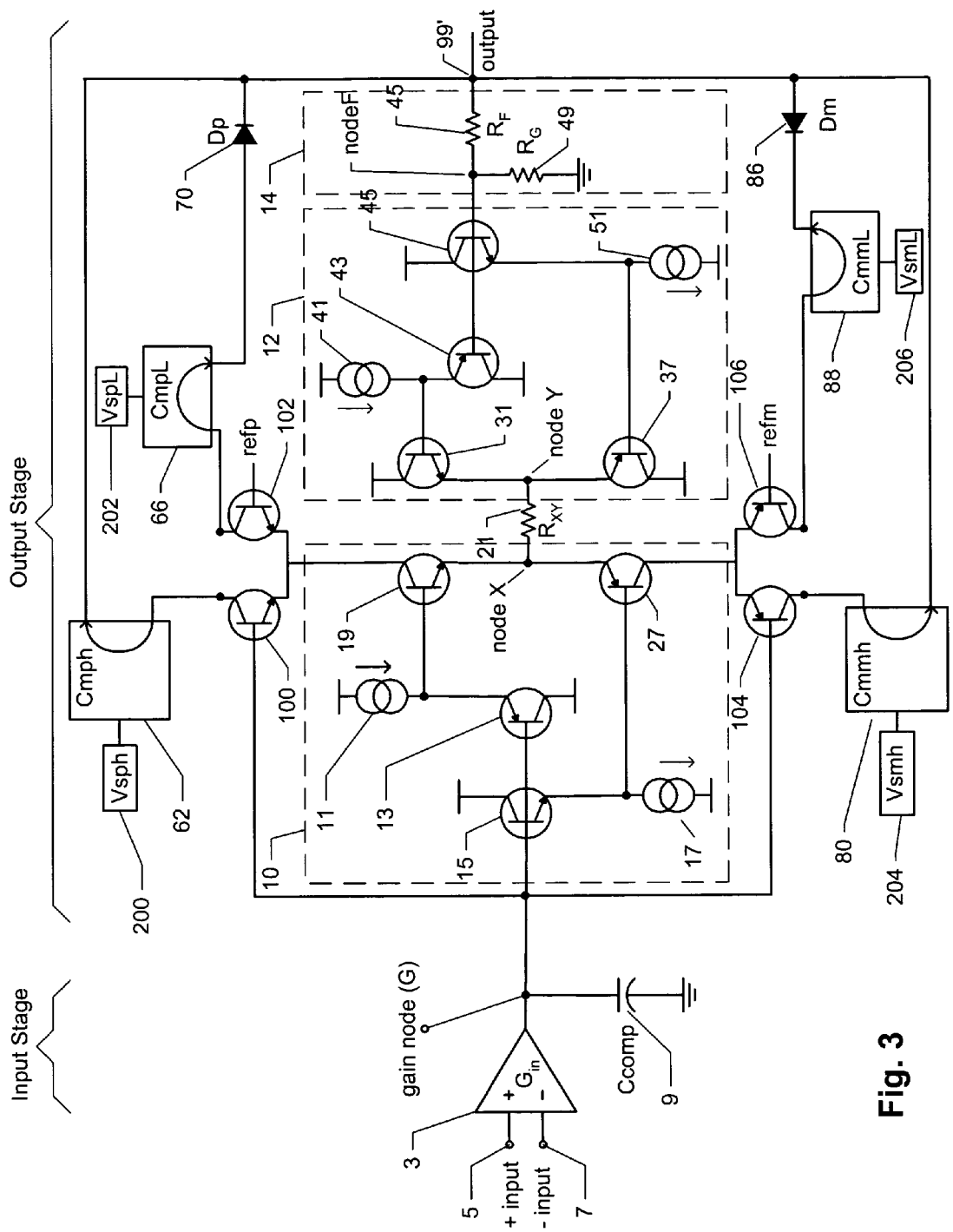
FIG. 3 is a schematic diagram depicting additional details of a Class-G amplifier, according to an embodiment of the present invention.

Referring now to FIG. 3, in accordance with an embodiment of the present invention, the comparator 68 and the switch 69 can be implemented using a pair of transistors 100 and 102. The emitters of transistors 100 and 102 are connected together and to the collector of transistor 19. The base of transistor 100 is connected to the gain node (G). The base of transistor 102 receives the voltage reference (refp). The collector of transistor 100 is connected to the input of current mirror Cmph 62, and the collector of transistor 202 is connected to the input of current mirror CmpL 66. In this arrangement, when the voltage at the gain node (G) presented to the base of transistor 100 is lower than the voltage reference (refp) presented to the base of transistor 102, the collector current of transistor 19 is steered through transistor 102 to the input of current mirror CmpL 66. When the voltage at the gain node (G) presented to the base of transistor 100 is higher than the reference (refp) presented to the base of transistor 102, the collector current of transistor 19 is steered through transistor 100 to the input of Cmph 62.

Similarly, the comparator 82 and the switch 84 can be implemented using a pair of transistors 104 and 106, in accordance with an embodiment of the present invention. The emitters of transistors 104 and 106 are connected together and to the collector of transistor 27. The base of transistor 104 is connected to the gain node (G). The base of transistor 106 receives the voltage reference (refm). The collector of transistor 100 is connected to the input of current mirror Cmmh 80, and the collector of transistor 106 is connected to the input of current mirror CmmL 88. In this arrangement, when the voltage at the gain node (G) presented to the base of transistor 104 is higher (e.g., less negative) than the reference voltage (refm) presented to the base of transistor 106, the collector current of transistor 27 is steered through transistor 106 to the input of current mirror CmmL 88. When the voltage at the gain node (G) presented to the base of transistor 104 is a lower (e.g., more negative) than the reference voltage (refm) presented to the base of transistor 106, the collector current of transistor 27 is steered through transistor 104 to the input of current mirror Cmmh 80.

As explained above in the discussion of FIG. 1, the signal at node X will be steered to through either transistor 19 or transistor 27. The comparator 68 and switch 69 (which can be transistors 100 and 102) will steer any signal presented at the collector of transistor 19 to either current mirror Cmph 62 or current mirror CmpL 66, as was just described. Similarly, the comparator 82 and switch 84 (which can be transistors 104 and 106) will steer any signal presented at the collector of transistor 27 to either current mirror Cmmh 80 or current mirror CmhL 88.

Figure 6:
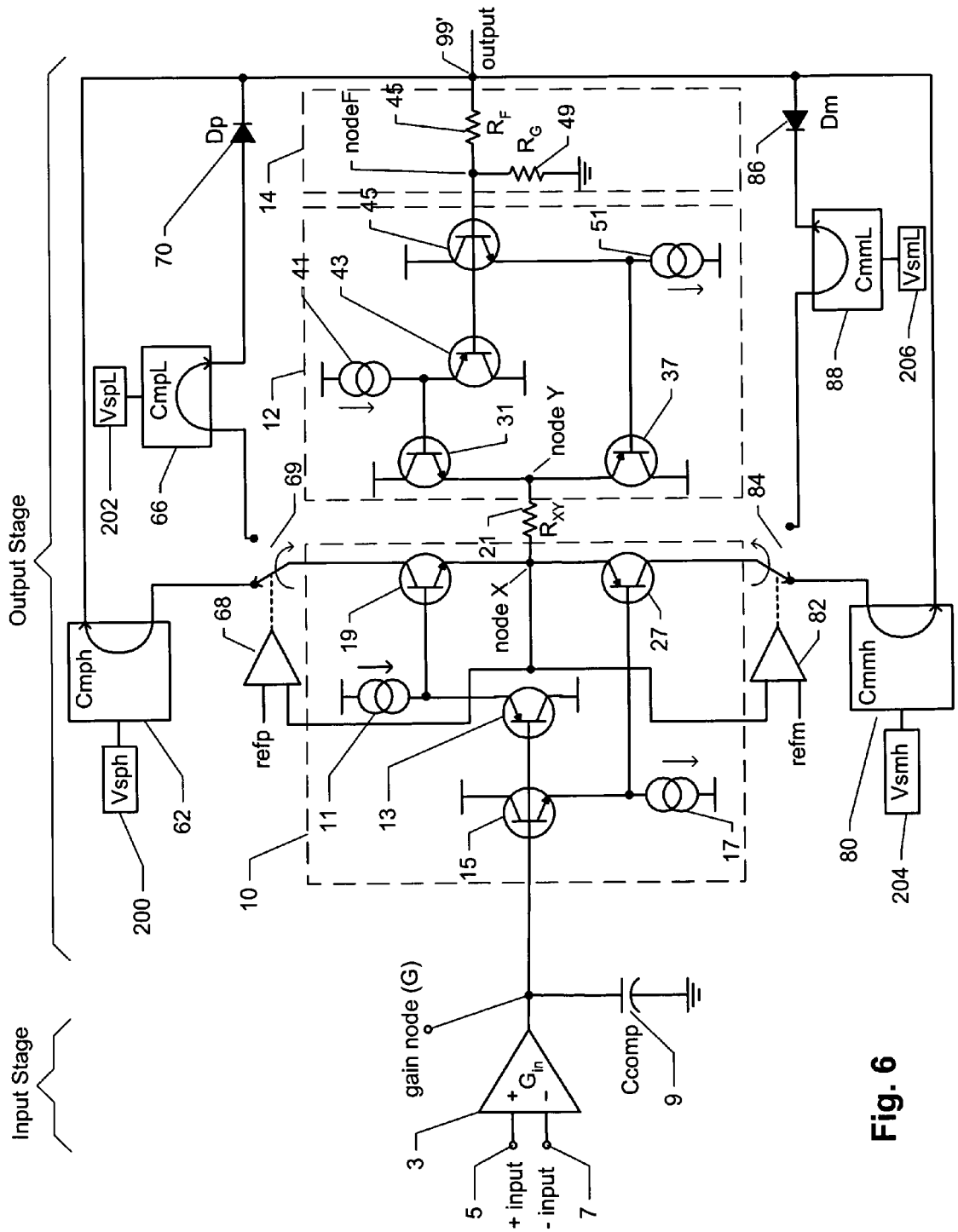
FIG. 6 is a schematic diagram depicting a Class-G amplifier, according to another embodiment of the present invention.
Figure 7:
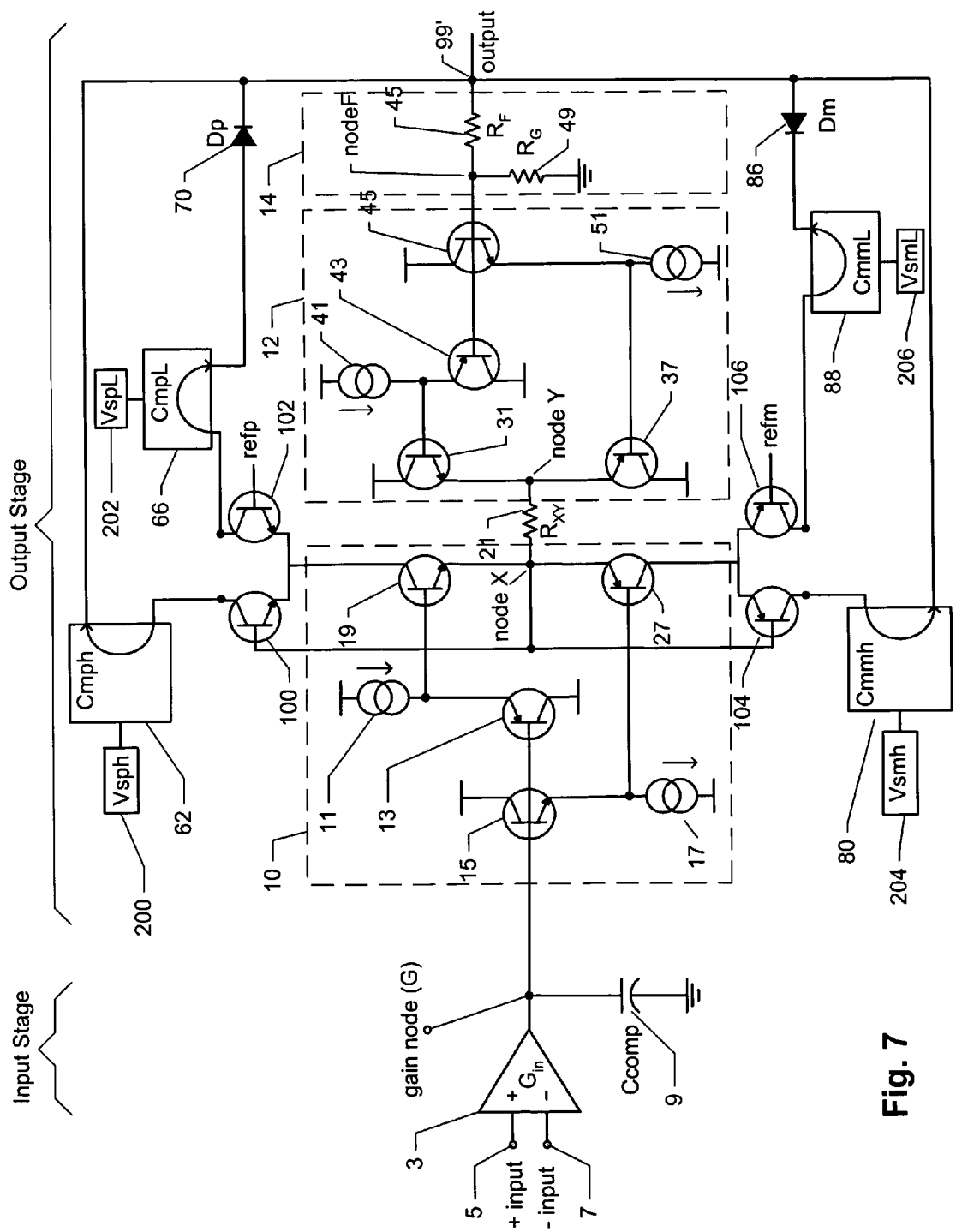
FIG. 7 is a schematic diagram depicting additional details of a Class-G amplifier, according to an embodiment of the present invention.

As mentioned above, the signal at the output of the first buffer 10 (i.e., at node X) should be equal to the signal at the gain node (G). Accordingly, rather than connecting the gain node (G) to inputs of the comparators 68 and 82 (which can be the bases of transistors 100 and 104) as shown in FIGS. 2 and 3, the inputs of comparators 68 and 82 (which can be the bases of transistors 100 and 104) can be connected to node X, as shown in FIGS. 6 and 7.

In accordance with an embodiment of the present invention, a diode 70 (Dp) is placed between the output of current mirror CmpL 66 and the amplifier output 99', and a diode 86 (Dm) is placed between the output of current mirror CmmL 88 and the amplifier output 99', as shown in FIGS. 2 and 3. The diode 70 (Dp) protects current mirror CmpL 66 from being reverse-biased when the amplifier output 99' is above VspL 202. Similarly, the diode 86 (Dm) protects current mirror CmmL 88 from being reverse biased when the amplifier output 99' is below VsmL 206. However, these diodes may not be needed in different process applications.

It is within the scope of the present invention that the bipolar junction transistors (BJTs) shown in the FIGS. can be replaced with field effect transistors (FETs), such as junction field effect transistors (JFETs), metal oxide semiconductor field effect transistors (MOSFETs) or metal semiconductor field effect transistors (MESFETs), with similar behavior.

In accordance with an embodiment of the present invention, a unity gain buffer can be placed between the gain node (G) and the input to the comparator 68. Similarly, a unity gain buffer can be placed between the gain node (G) and the input to comparator 82. Such buffers prevent switching currents from effecting the gain node (G).

In accordance with an embodiment of the present invention, it is preferred that all of the current mirrors Cmph 62, CmpL 66, Cmmh 80 and CmmL 88 have the same current gains to minimize distortions.

In the Class-G amplifier, the upper and lower rails used to power the transistors and current sources within the buffers 10 and 12 (as described above with reference to FIG. 1) are preferably run off of the low voltage supplies VspL 202 and VsmL 206.

It is within the scope of the present invention that the first buffer 10 and the feedback buffer 12 can be implemented in other ways. In accordance with an embodiment of the present invention, the feedback buffer 12 is removed.

It is within the scope of the present invention that the voltage divider network can be implemented in other ways. In accordance with an embodiment of the present invention, the voltage divider network 14 is removed, causing the amplifier output 99' to be fed back directly into the feedback buffer 12. This is equivalent to making the feedback resistor 45 ($R_F$) approach zero ohms (or a short circuit) and making the gain resistor 49 ($R_G$) approach infinity (or an open circuit).

Figure 4:
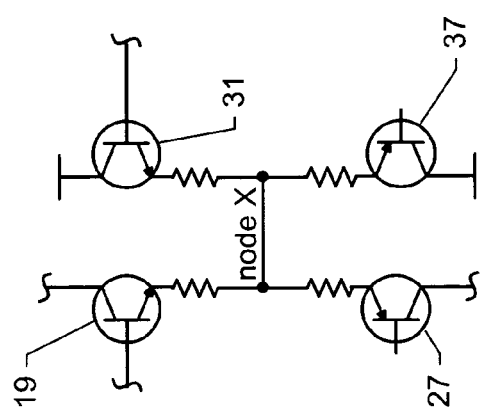
FIG. 4 is a schematic diagram of an alternative resistor network that can be used in the embodiments of the present invention.

It is within the scope of the present invention that the resistor $R_{XY}$ can be replaced with a multiple resistor network, as shown in FIG. 4.

Figure 5:
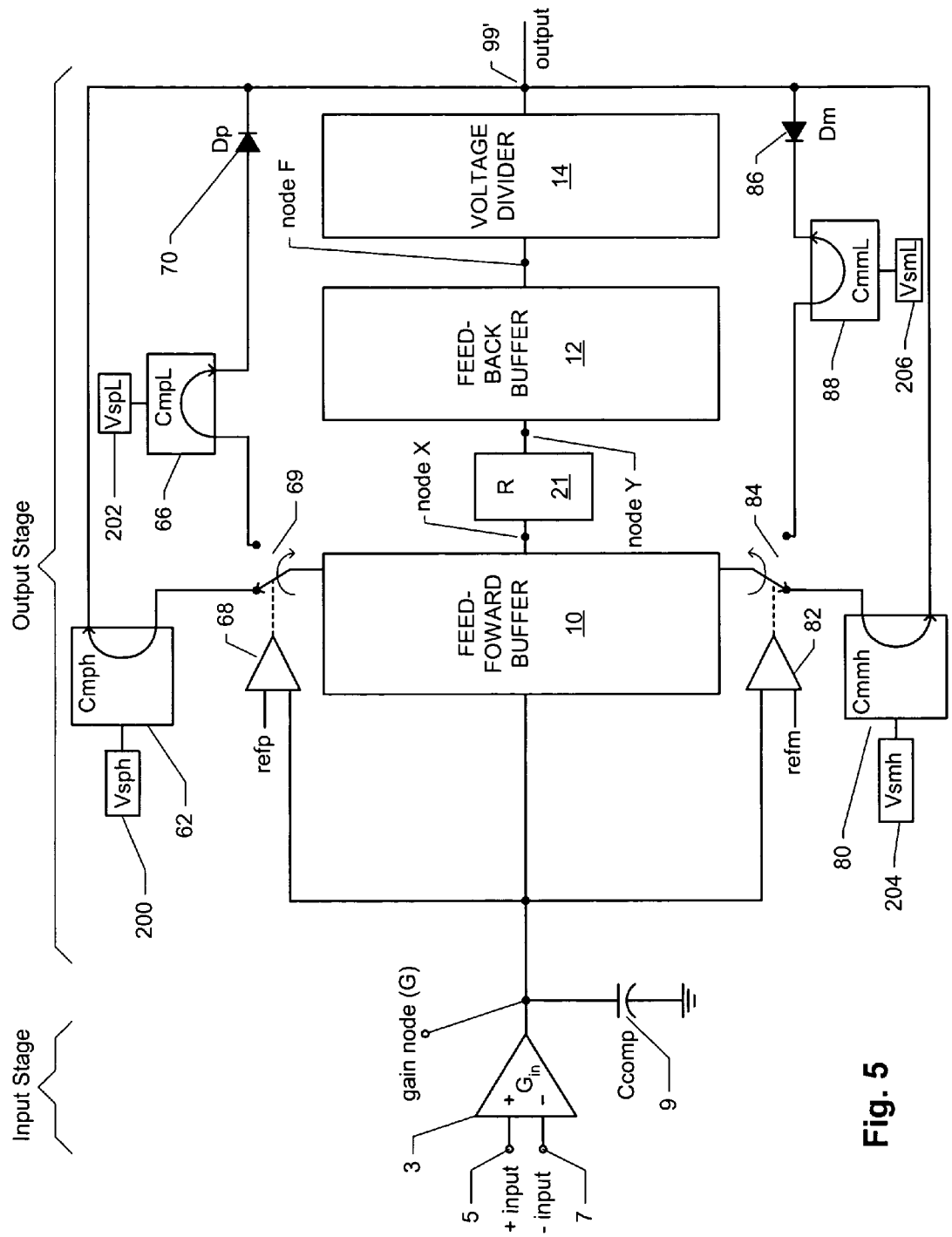
FIG. 5 is a high level diagram depicting a Class-G amplifier, according to an embodiment of the present invention.

FIG. 5 is a higher level diagram depicting a Class-G amplifier, according to an embodiment of the present invention. In this diagram, details of the various blocks have been left out. Accordingly, this diagram is useful for describing high level operation of the Class-G amplifier output stage. As previously described, the buffer 10 includes an input (node G) and an output (node X), with the input of the buffer forming an input of the output stage. At a high level, the buffer 10 steers its output either to the switch 69 or to the switch 84. When the buffer 10 steers its output to the switch 69, the switch 69 connects the output of the buffer 10 to either the input to current mirror CmpL or the input to current mirror Cmph,. Similarly, when the buffer 10 steers its output to the switch 84, the switch 84 connects the output (node X) of the buffer 10 to either the input to current mirror CmmL or the input to current mirror Cmmh. The comparator 68 receives both the input (node G) to the buffer 10 (or the output of the buffer 10, which is a buffered version of the input) and the reference voltage refp, and provides an output that controls the switch 69. Similarly, the comparator 82 receives both the input (node G) to the buffer 10 (or the output of the buffer 10, which is a buffered version of the input) and the reference voltage refm, and provides an output that controls the switch 84.

The voltage divider 14 produces a divided down or ratioed version of the amplifier output 99' at the feedback node (F). The feedback buffer 12 buffers the voltage at the feedback node (F) and presents it to the node Y. If the voltage at the gain node (G) does not equal the voltage at the feedback node (F), or more specifically, if the voltage at node X does not equal the voltage at the node Y, then the resistor network 21 (which can be a single resistor, or multiple resistors) produces an error current. The buffer 10 feeds the error current through one of the current mirrors back to the amplifier output 99', causing the voltage at the amplifier output 99' to be servo'ed back to agreement with the voltage at the gain node (G) (times the voltage divider ratio).

It is noted that the terms high and higher, as used herein, have been used as relative terms, as have the terms low and lower. For example, by referring to Vsph 200 as a high voltage supply, and VspL 202 as a low voltage supply, the intent is merely to show that Vsph 200 supplies a higher voltage potential (e.g., +12V) than VspL 202 (e.g., +5V). Similarly, by referring to Vsmh 204 as a high voltage supply, and VsmL 206 as a low voltage supply, the intent is merely to show the Vsmh supplies a higher voltage potential (e.g., −12V) than VsmL (e.g., −5V).

Although the present invention has been described above with particularity, this was merely to teach one of ordinary skill in the art how to make and use the invention. Many additional modification will fall within the scope of the invention, as the scope is defined by the claims with follow.

What is claimed is:

1. An output stage for a Class-G amplifier, comprising:
   a first current mirror (CmpL) powered by a first low voltage supply (VspL);
   a second current mirror (Cmph) powered by a first high voltage supply (Vsph);
   a third current mirror (CmmL) powered by a second low voltage supply (VsmL);
   a fourth current mirror (Cmmh) powered by a second high voltage supply (Vsmh);
   each said current mirror including an input and an output, said outputs of said current mirrors connected together to form an output of the output stage;
   a buffer (10) including an input (node G) and an output (node X), said buffer (10) also including a first transistor (19) and a second transistor (27) connected in an emitter follower configuration, said input of said buffer forming an input of the output stage;
   a first switch (69) to connect a collector of said first transistor (19) to either said input to said first current mirror (CmpL) or said input to said second current mirror (Cmph);
   a first comparator (68) receiving said input (node G) to said buffer (10), receiving a first reference voltage (refp), and providing an output, wherein said output of said first comparator (68) controls whether said first switch (69) connects said collector of said first transistor (19) to either said input to said first current mirror (CmpL) or said input to said second current mirror (Cmph);

a second switch (84) to connect a collector of said second transistor (27) to either said input to said third current mirror (CmmL) or said input to said fourth current mirror (Cmmh); and a second comparator (82) receiving said input (node G) to said buffer (10), receiving a second reference voltage (refm), and providing an output, wherein said output of said second comparator (82) controls whether said second switch (84) connects said collector of said second transistor (27) to either said input to said third current mirror (CmmL) or said input to said fourth current mirror (Cmmh).

2. The output stage of claim 1, wherein said buffer (10) steers its output either through said first transistor (19) to said first switch (69) or through said second transistor (27) to said second switch (84).

3. The output stage of claim 2, wherein:

said first switch (69) includes an input terminal and first and second output terminals, said input terminal connected to said collector of said first transistor (19), said first output terminal connected to said input to said first current mirror (CmpL), and said second output terminal connected to said input to said second current mirror (Cmph); and said second switch (84) including an input terminal and first and second output terminals, said input terminal connected to said collector of said second transistor (27), said first output terminal connected to said input to said third current mirror (CmmL), and said second output terminal connected to said input to said fourth current mirror (Cmmh).

4. The output stage of claim 1, wherein and said first comparator (68) and said first switch (69) collectively comprise:

a third transistor (100) including a base connected to said input (node G) to said buffer (10), a collector connected to said input to said second current mirror (Cmph), and an emitter connected to said collector of said first transistor (19); and a fourth transistor (102) including a base receiving said first reference voltage (refp), a collector connected to said input to said first current mirror (CmpL), and an emitter connected to said collector of said first transistor (19).

5. The output stage of claim 4, wherein and said second comparator (82) and said second switch (84) collectively comprise:

a fifth transistor (104) including a base connected to said input (node G) to said buffer (10), a collector connected to said input to said fourth current mirror (Cmmh), and an emitter connected to said collector of said second transistor (27); and a sixth transistor (106) including a base receiving said second reference voltage (refm), a collector connected to said input to said third current mirror (CmmL), and an emitter connected to said collector of said second transistor (27).

6. The output stage of claim 1, further comprising:

a first diode (Dp) connected between said output of said first current mirror (CmpL) and the output of the output stage, said first diode to prevent said first current mirror (CmpL) from being reversed biased; and a second diode (Dm) connected between said output of said third current mirror (CmmL) and the output of the output stage, said second diode to prevent said third current mirror (CmmL) from being reversed biased.

7. The output stage of claim 1, further comprising:

a feedback buffer (12); and a voltage divider network (14).

8. An output stage for a Class-G amplifier, comprising:

a first current mirror (CmpL) powered by a first low voltage supply (VspL);

a second current mirror (Cmph) powered by a first high voltage supply (Vsph);

a third current mirror (CmmL) powered by a second low voltage supply (VsmL);

a fourth current mirror (Cmmh) powered by a second high voltage supply (Vsmh);

each said current mirror including an input and an output, said outputs of said current mirrors connected together to form an output of the output stage;

a buffer (10) including an input (node G) and an output (node X), said buffer (10) also including a first transistor (19) and a second transistor (27) connected in an emitter follower configuration, said input of said buffer forming an input of the output stage;

a first switch (69) to connect a collector of said first transistor (19) to either said input to said first current mirror (CmpL) or said input to said second current mirror (Cmph);

a first comparator (68) receiving said output (node X) of said buffer (10), receiving a first reference voltage (refp), and providing an output, wherein said output of said first comparator (68) controls whether said first switch (69) connects said collector of said first transistor (19) to either said input to said first current mirror (CmpL) or said input to said second current mirror (Cmph);

a second switch (84) to connect a collector of said second transistor (27) to either said input to said third current mirror (CmmL) or said input to said fourth current mirror (Cmmh); and a second comparator (82) receiving said output (node X) of said buffer (10), receiving a second reference voltage (refm), and providing an output, wherein said output of said second comparator (82) controls whether said second switch (84) connects said collector of said second transistor (27) to either said input to said third current mirror (CmmL) or said input to said fourth current mirror (Cmmh).

9. The output stage of claim 8, wherein said buffer (10) steers its output either through said first transistor (19) to said first switch (69) or through said second transistor (27) to said second switch (84).

10. The output stage of claim 9, wherein:

said first switch (69) includes an input terminal and first and second output terminals, said input terminal connected to said collector of said first transistor (19), said first output terminal connected to said input to said first current mirror (CmpL), and said second output terminal connected to said input to said second current mirror (Cmph); and said second switch (84) including an input terminal and first and second output terminals, said input terminal connected to said collector of said second transistor (27), said first output terminal connected to said input to said third current mirror (CmmL), and said second output terminal connected to said input to said fourth current mirror (Cmmh).

11. The output stage of claim 8, wherein and said first comparator (68) and said first switch (69) collectively comprise:
- a third transistor (100) including a base connected to said output (node X) of said buffer (10), a collector connected to said input to said second current mirror (Cmph), and an emitter connected to said collector of said first transistor (19); and
- a fourth transistor (102) including a base receiving said first reference voltage (refp), a collector connected to said input to said first current mirror (CmpL), and an emitter connected to said collector of said first transistor (19).

12. The output stage of claim 11, wherein and said second comparator (82) and said second switch (84) collectively comprise:
- a fifth transistor (104) including a base connected to said output (node X) of said buffer (10), a collector connected to said input to said fourth current mirror (Cmmh), and an emitter connected to said collector of said second transistor (27); and
- a sixth transistor (106) including a base receiving said second reference voltage (refm), a collector connected to said input to said third current mirror (CmmL), and an emitter connected to said collector of said second transistor (27).

13. The output stage of claim 8, further comprising:
- a first diode (Dp) connected between said output of said first current mirror (CmpL) and the output of the output stage, said first diode to prevent said first current mirror (CmpL) from being reversed biased; and
- a second diode (Dm) connected between said output of said third current mirror (CmmL) and the output of the output stage, said second diode to prevent said third current mirror (CmmL) from being reversed biased.

14. The output stage of claim 8, further comprising:
- a feedback buffer (12); and
- a voltage divider network (14).

15. An output stage for a Class-G amplifier, comprising:
- a first current mirror (CmpL) powered by a first low voltage supply (VspL);
- a second current mirror (Cmph) powered by a first high voltage supply (Vsph);
- a third current mirror (CmmL) powered by a second low voltage supply (VsmL);
- a fourth current mirror (Cmmh) powered by a second high voltage supply (Vsmh);
- each said current mirror including an input and an output, said outputs of said current mirrors connected together to form an output of the output stage;
- a buffer (10) including an input (node G) and an output (node X), said input of said buffer forming an input of the output stage, wherein said buffer (10) steers its output either to a first switch (69) or to a second switch (84);
- wherein said first switch (69) connects said output (node X) of said buffer (10) to either said input to said first current mirror (CmpL) or said input to said second current mirror (Cmph), when said buffer (10) steers its output to said first switch (69);
- wherein said second switch (84) connects said output (node X) of said buffer (10) to either said input to said third current mirror (CmmL) or said input to said fourth current mirror (Cmmh), when said buffer (10) steers its output to said second switch (84);
- a first comparator (68) receiving said input (node G) to said buffer (10), receiving a first reference voltage (refp), and providing an output, wherein said output of said first comparator (68) controls said first switch (69); and
- a second comparator (82) receiving said input (node G) to said buffer (10), receiving a second reference voltage (refm), and providing an output, wherein said output of said second comparator (82) controls said second switch (84).

16. The output stage of claim 15, wherein and said first comparator (68) and said first switch (69) collectively comprise:
- a first transistor (100) including a control terminal connected to said input (node G) to said buffer (10), and a current path connected between said output (node X) of said buffer (10) and said input to said second current mirror (Cmph); and
- a second transistor (102) including a control terminal receiving said first reference voltage (refp), and a current path connected between said output (node X) of said buffer and said input to said first current mirror (CmpL).

17. The output stage of claim 16, wherein and said second comparator (82) and said second switch (84) collectively comprise:
- a third transistor (104) including a control terminal connected to said input (node G) to said buffer (10), and a current path connected between said output (node X) of said buffer (10) and said input to said fourth current mirror (Cmmh); and
- a fourth transistor (106) including a control terminal receiving said second reference voltage (refm), and a current path connected between said output (node X) of said buffer (10) and said input to said third current mirror (CmmL).

18. The output stage of claim 17, wherein:
- a current path of a fifth transistor (19) connects said output (node X) of said buffer (10) to said current paths of said first and second transistors (100, 102); and
- a current path of a sixth transistor (27) connects said output (node X) of said buffer (10) to said current paths of said third and fourth transistors (104, 106).

19. The output stage of claim 18, wherein each said transistor comprises a bipolar junction transistor, each said control terminal comprises a base terminal, and each said current path comprises a path between a collector and an emitter.

20. The output stage of claim 18, wherein each said transistor comprises a field effect transistor, each said control terminal comprises a gate, and each said current path comprises a path between a source and a drain.

21. An output stage for a Class-G amplifier, comprising:
- a first current mirror (CmpL) powered by a first low voltage supply (VspL);
- a second current mirror (Cmph) powered by a first high voltage supply (Vsph);
- a third current mirror (CmmL) powered by a second low voltage supply (VsmL);
- a fourth current mirror (Cmmh) powered by a second high voltage supply (Vsmh);
- each said current mirror including an input and an output, said outputs of said current mirrors connected together to form an output of the output stage;
- a buffer (10) including an input (node G) and an output (node X), said input of said buffer forming an input of the output stage, wherein said buffer (10) steers its output either to a first switch (69) or to a second switch (84);

wherein said first switch (69) connects said output (node X) of said buffer (10) to either said input to said first current mirror (CmpL) or said input to said second current mirror (Cmph), when said buffer (10) steers its output to said first switch (69);

wherein said second switch (84) connects said output (node X) of said buffer (10) to either said input to said third current mirror (CmmL) or said input to said fourth current mirror (Cmmh), when said buffer (10) steers its output to said second switch (84);

a first comparator (68) receiving said output (node X) of said buffer (10), receiving a first reference voltage (refp), and providing an output, wherein said output of said first comparator (68) controls said first switch (69); and a second comparator (82) receiving said output (node X) of said buffer (10), receiving a second reference voltage (refm), and providing an output, wherein said output of said second comparator (82) controls said second switch (84).

22. The output stage of claim 21, wherein and said first comparator (68) and said first switch (69) collectively comprise:

a first transistor (100) including a control terminal connected to said output (node X) of said buffer (10), and a current path connected between said output (node X) of said buffer (10) and said input to said second current mirror (Cmph); and a second transistor (102) including a control terminal receiving said first reference voltage (refp), and a current path connected between said output (node X) of said buffer and said input to said first current mirror (CmpL).

23. The output stage of claim 22, wherein and said second comparator (82) and said second switch (84) collectively comprise:

a third transistor (104) including a control terminal connected to said output (node X) of said buffer (10), and a current path connected between said output (node X) of said buffer (10) and said input to said fourth current mirror (Cmmh); and a fourth transistor (106) including a control terminal receiving said second reference voltage (refm), and a current path connected between said output (node X) of said buffer (10) and said input to said third current mirror (CmmL).

24. The output stage of claim 23, wherein:

a current path of a fifth transistor (19) connects said output (node X) of said buffer (10) to said current paths of said first and second transistors (100, 102); and a current path of a sixth transistor (27) connects said output (node X) of said buffer (10) to said current paths of said third and fourth transistors (104, 106).

25. The output stage of claim 24, wherein each said transistor comprises a bipolar junction transistor, each said control terminal comprises a base terminal, and each said current path comprises a path between a collector and an emitter.

26. The output stage of claim 24, wherein each said transistor comprises a field effect transistor, each said control terminal comprises a gate, and each said current path comprises a path between a source and a drain.

\* \* \* \* \*